United States Patent
Chung et al.

(10) Patent No.: US 8,785,912 B2
(45) Date of Patent: Jul. 22, 2014

(54) GRAPHENE ELECTRONIC DEVICE INCLUDING A PLURALITY OF GRAPHENE CHANNEL LAYERS

(75) Inventors: Hyun-jong Chung, Hwaseong-si (KR); Jae-hong Lee, Anyang-si (KR); Jae-ho Lee, Seoul (KR); Hyung-cheol Shin, Seoul (KR); Sun-ae Seo, Hwaseong-si (KR); Sung-hoon Lee, Hwaseong-si (KR); Jin-seong Heo, Suwon-si (KR); Hee-jun Yang, Seoul (KR)

(73) Assignees: Samsung Electronics Co., Ltd., Gyeonggi-Do (KR); SNU R&DB Foundation, Seoul (KR)

( * ) Notice: Subject to any disclaimer, the term of this patent is extended or adjusted under 35 U.S.C. 154(b) by 78 days.

(21) Appl. No.: 13/225,988

(22) Filed: Sep. 6, 2011

(65) Prior Publication Data

US 2012/0168722 A1   Jul. 5, 2012

(30) Foreign Application Priority Data

Dec. 29, 2010   (KR) .......................... 10-2010-0138041

(51) Int. Cl.
*H01L 29/775*   (2006.01)
*B82Y 99/00*   (2011.01)

(52) U.S. Cl.
USPC ....... 257/29; 257/E29.245; 977/734; 977/938

(58) Field of Classification Search
CPC ............ H01L 29/775; H01L 29/66045; H01L 29/1606

USPC ............................................. 977/734; 257/29
See application file for complete search history.

(56) References Cited

U.S. PATENT DOCUMENTS

| | | | |
|---|---|---|---|
| 8,188,460 B2 * | 5/2012 | Banerjee et al. | 257/39 |
| 2003/0094656 A1 * | 5/2003 | Koyama et al. | 257/351 |
| 2007/0018342 A1 | 1/2007 | Sandhu et al. | |
| 2010/0006823 A1 | 1/2010 | Anderson et al. | |
| 2010/0090759 A1 | 4/2010 | Shin et al. | |
| 2010/0127243 A1 * | 5/2010 | Banerjee et al. | 257/39 |
| 2010/0181655 A1 | 7/2010 | Colombo et al. | |
| 2011/0059599 A1 * | 3/2011 | Ward et al. | 438/507 |
| 2011/0101309 A1 * | 5/2011 | Lin et al. | 257/29 |
| 2012/0049160 A1 * | 3/2012 | Sano et al. | 257/27 |

FOREIGN PATENT DOCUMENTS

| | | | |
|---|---|---|---|
| JP | 2008205272 A | | 9/2008 |
| JP | 2009-277803 A | | 11/2009 |
| JP | WO 2010113518 | * | 10/2010 |
| KR | 20060107108 A | | 10/2006 |
| KR | 20090042590 A | | 4/2009 |

* cited by examiner

*Primary Examiner* — Kimberly Rizkallah
*Assistant Examiner* — Mounir Amer
(74) *Attorney, Agent, or Firm* — Harness, Dickey & Pierce, P.L.C.

(57) ABSTRACT

Graphene electronic devices may include a gate electrode on a substrate, a first gate insulating film covering the gate electrode, a plurality of graphene channel layers on the substrate, a second gate insulating film between the plurality of graphene channel layers, and a source electrode and a drain electrode connected to both edges of each of the plurality of graphene channel layers.

12 Claims, 3 Drawing Sheets

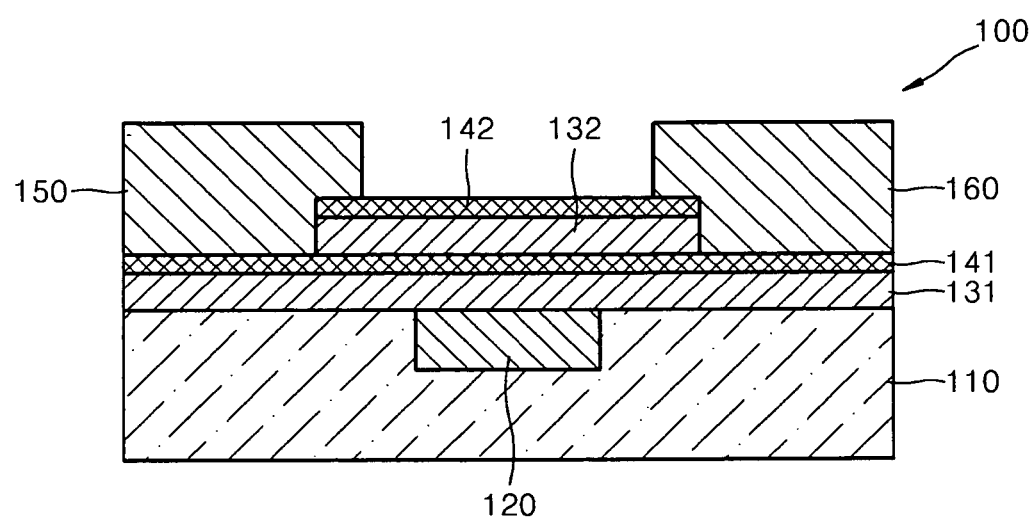

GRAPHENE ELECTRONIC DEVICE INCLUDING A PLURALITY OF GRAPHENE CHANNEL LAYERS

CROSS-REFERENCE TO RELATED APPLICATIONS

This application claims the benefit of Korean Patent Application No. 10-2010-0138041, filed on Dec. 29, 2010, in the Korean Intellectual Property Office, the entire contents of which are incorporated herein by reference.

BACKGROUND

1. Field

Example embodiments relate to graphene electronic devices including a plurality of separated graphene channel layers.

2. Description of the Related Art

Graphene having a 2-dimensional hexagonal carbon structure is a material that may replace semiconductors. Graphene is a zero gap semiconductor and has a mobility of 100,000 $cm^2V^{-1}s^{-1}$ at room temperature, which is approximately 100 times higher than that of silicon. Thus, graphene can be applied to high frequency devices, e.g., radio frequency (RF) devices.

When a graphene nano-ribbon (GNR) having a graphene channel width of 10 nm or less is formed, a band gap may be formed by a size effect. Using the GNR, a field effect transistor that can be operated at room temperature can be manufactured. Graphene electronic devices refer to electronic devices that include graphene, e.g., a field effect transistor or an RF transistor.

SUMMARY

Example embodiments provide a graphene electronic device having a plurality of graphene channel layers in which drain current and current gain characteristics are improved. Additional aspects will be set forth in part in the description which follows and, in part, will be apparent from the description, or may be learned by practice of example embodiments.

According to example embodiments, a graphene electronic device may include a gate electrode on a substrate, a first gate insulating film covering the gate electrode, a plurality of graphene channel layers on the first gate insulating film, a second gate insulating film between the plurality of the graphene channel layers and a source electrode and a drain electrode connected to both edges of each of the plurality of the graphene channel layers.

The plurality of the graphene channel layers may include a first graphene channel layer on the first gate insulating film and a second graphene channel layer on the second gate insulating film. The gate electrode may be embedded in the substrate and an upper surface of the gate electrode may contact the first gate insulating film. The substrate may be a conductive substrate. The second gate insulating film may have a thickness in a range from about 10 nm to about 200 nm.

The source electrode and the drain electrode may be formed on the first and second graphene channel layers to respectively contact both edges of the first and second graphene channel layers. The first graphene channel layer may have a length greater than that of the second graphene channel layer. The second gate insulating film may be formed of a material selected from the group consisting of silicon oxide, silicon nitride, hafnium oxide, and aluminum oxide.

According to example embodiments, a graphene electronic device may include a plurality of graphene channel layers on a substrate, a first gate insulating film between the plurality of the graphene channel layers, a source electrode and a drain electrode connected to both edges of each of the plurality of the graphene channel layers, a second gate insulating film covering the plurality of graphene channel layers between the source electrode and the drain electrode and a gate electrode on the second gate insulating film.

The graphene electronic device may further include an insulating layer covering the substrate, wherein the plurality of graphene channel layers includes a first graphene channel layer on the insulating layer and a second graphene channel layer on the first gate insulating film.

BRIEF DESCRIPTION OF THE DRAWINGS

These and/or other aspects will become apparent and more readily appreciated from the following description of the embodiments, taken in conjunction with the accompanying drawings of which:

FIG. 1 is a schematic cross-sectional view showing a structure of a graphene electronic device according to example embodiments;

FIGS. 2 through 4 are graphs showing simulation results of a graphene electronic device having two graphene channel layers according to example embodiments and a comparative example of a graphene electronic device having a single graphene channel layer.

DETAILED DESCRIPTION

Figure 3:
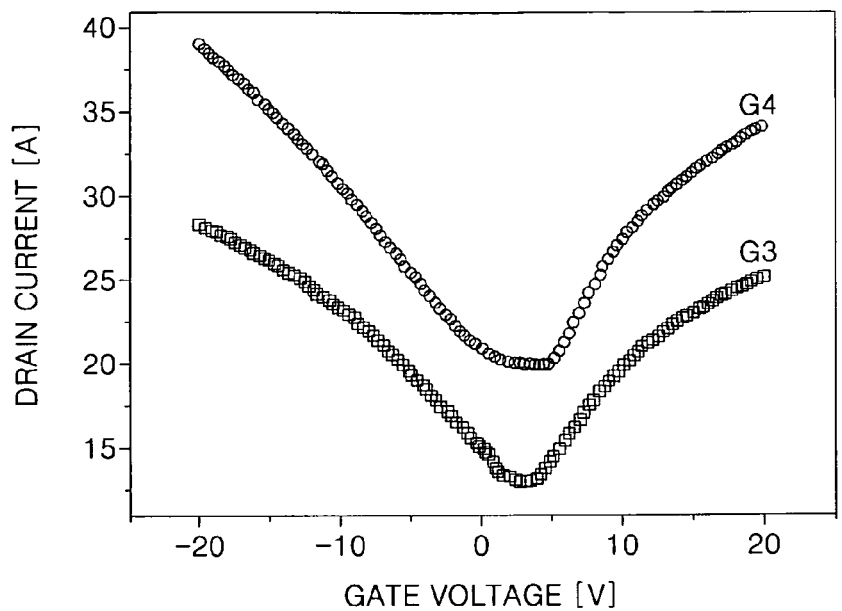

Reference will now be made in detail to embodiments, examples of which are illustrated in the accompanying drawings. In the drawings, the thicknesses of layers and regions are exaggerated for clarity, and like reference numerals refer to the like elements throughout.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic cross-sectional view showing a structure of a graphene electronic device 100 according to example embodiments. Referring to FIG. 1, a gate electrode 120 may be embedded in a surface of a substrate 110. The gate electrode 120 may be formed of a conductive material, for example, aluminum. All side surfaces of the gate electrode 120 except an upper surface may be surrounded by the substrate 110. The substrate 110 may be a silicon substrate.

Example embodiments are not limited to an embodiment of the gate electrode 120 as illustrated in FIG. 1. For example, the gate electrode 120 may be formed such that only a lower surface of the gate electrode 120 may contact the upper surface of the substrate 110. Also, the substrate 110 may be a conductive substrate, and work as a gate electrode to replace the gate electrode 120.

A first gate insulating film 131 that covers the gate electrode 120 may be formed on the substrate 110. The first gate insulating film 131 may be formed to a thickness in a range from about 10 nm to about 200 nm by using silicon oxide, silicon nitride, hafnium oxide, or aluminum oxide.

A first graphene channel layer 141 may be formed on the first gate insulating film 131. The first graphene channel layer 141 may be formed by transferring a single-layer graphene or a double-layer graphene.

A second gate insulating film 132 may be formed on the first graphene channel layer 141. The second gate insulating film 132 may be formed to expose both edges of the first graphene channel layer 141. A second graphene channel layer 142 may be formed on the second gate insulating film 132. The second graphene channel layer 142 may be separated from the first graphene channel layer 141.

The second gate insulating film 132 may be formed to a thickness in a range from about 10 nm to about 200 nm by using silicon oxide, silicon nitride, hafnium oxide, or aluminum oxide. When the second gate insulating film 132 has a thickness of 10 nm or less, there is a risk of electrical connection between the first graphene channel layer 141 and the second graphene channel layer 142, and also, carrier mobility between the first graphene channel layer 141 and the second graphene channel layer 142 may be reduced due to carrier movement therebetween. When the second gate insulating film 132 has a thickness of 200 nm or above, a higher voltage may be required for the gate electrode 120 to control the graphene channel layers 141 and 142. The first graphene channel layer 141 may have a length greater than that of the second graphene channel layer 142.

A source electrode 150 and a drain electrode 160 respectively connected to edges of the first and second graphene channel layers 141 and 142 may be formed on the first gate insulating film 131. Charge movement from the source electrode 150 to the drain electrode 160 may be realized through the first and second graphene channel layers 141 and 142.

The graphene electronic device 100 of FIG. 1 is a back gate type transistor. When the first and second graphene channel layers 141 and 142 are formed to have a width in a range from about 1 nm to about 20 nm, the first and second graphene channel layers 141 and 142 may have a semiconductor characteristic having a band gap due to a size effect. Accordingly, the graphene electronic device 100 of FIG. 1 is a field effect transistor. A field effect transistor that includes graphene as a channel may be operated at room temperature.

When the first and second graphene channel layers 141 and 142 have a width of about 100 nm or above, the graphene channel layers 141 and 142, as an electric conductor, may have a carrier mobility of 100,000 $cm^2V^{-1}s^{-1}$, which is about 100 times greater than that of silicon. The graphene electronic device having such graphene channel layers may be used as an RF transistor.

Example embodiments are not limited to the embodiment of the gate electrode 120 as illustrated in FIG. 1. For example, the graphene channel layers may include more than two layers and these graphene channel layers may be separated from each other.

Figure 4:
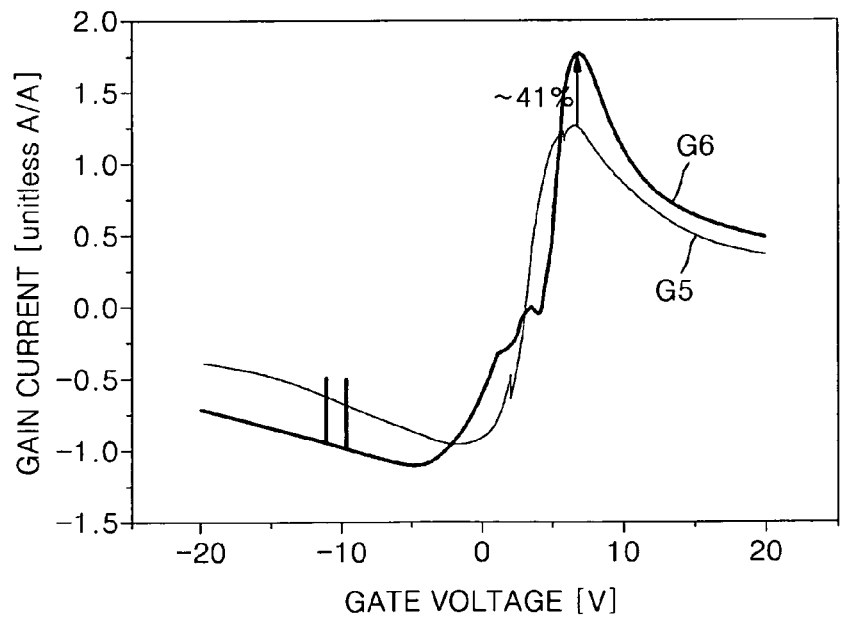

FIGS. 2 through 4 are graphs showing simulation results of a graphene electronic device having two graphene channel layers according to example embodiments and a comparative example of a graphene electronic device (referred to as a conventional electronic device) having a single graphene channel layer.

Referring to FIG. 2, a first graph G1 shows the current density variation of a conventional electronic device, and a second graph G2 shows the current density variation of a graphene electronic device according to example embodiments. The conventional electronic device shows one peak current density generated from a single channel layer. The graphene electronic device according to example embodiments shows two peak current densities respectively from the two channel layers. The amplitudes of the current value of a first peak P1 and the current value of a second peak P2 are slightly low when compared to the current value of a peak current value of the conventional electronic device. The current value of the first peak P1 of the first graphene channel layer is slightly higher than that of the second peak P2 of the second graphene channel layer. As seen in the graph of FIG. 2, a current from the source electrode to the drain electrode flows through both the first and second graphene channel layers, and an electric field formed by a voltage applied to the gate electrode is also transmitted to the second graphene channel layer as well as the first graphene channel layer.

Referring to FIG. 3, a third graph G3 shows an I-V characteristic curve of a conventional electronic device, and a fourth graph G4 shows an I-V characteristic curve of a graphene electronic device according to example embodiments. The graphene electronic device according to example embodiments may have a drain current greater than that of the conventional electronic device, because the sum of currents that flow through the two channel layers is greater than the current that flows through a single channel layer of the conventional electronic device.

Referring to FIG. 4, a fifth graph G5 shows the current gain of a conventional electronic device, and a sixth graph G6 represents the current gain of a graphene electronic device according to example embodiments. The graphene electronic device according to example embodiments shows a current gain higher by about 41% than the conventional electronic device.

Therefore, the driving voltage of the graphene electronic device 100 according to example embodiments is relatively low. Also, because the graphene electronic device 100 shows increased carrier mobility, the graphene electronic device 100 may be used in a circuit that requires a high speed operation.

Figure 5:
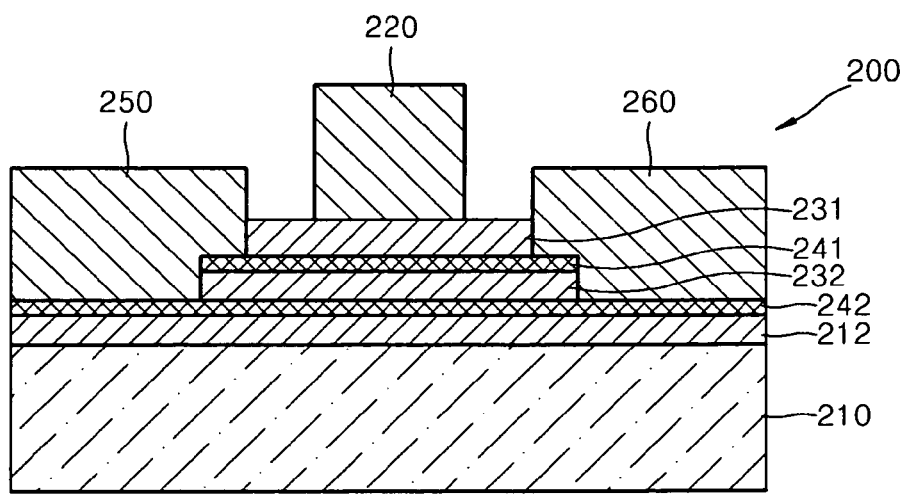
FIG. 5 is a schematic cross-sectional view showing a structure of a graphene electronic device according to example embodiments.

FIG. 5 is a schematic cross-sectional view showing a structure of a graphene electronic device 200 according to example embodiments. Referring to FIG. 5, an insulating layer 212 may be formed on a substrate 210. The substrate 210 may be a silicon substrate. If the substrate 210 is a non-conductive substrate, the insulating layer 212 may be omitted.

A second graphene channel layer 242 may be formed on the insulating layer 212. The second graphene channel layer 242 may be formed by transferring a single-layer or a double-layer of graphene.

A second gate insulating film 232 may be formed on the second graphene channel layer 242. A first graphene channel layer 241 may be formed on the second gate insulating film 232. The first graphene channel layer 241 may be separated from the second graphene channel layer 242.

The second gate insulating film 232 may be formed to a thickness in a range from about 10 nm to about 200 nm by using silicon oxide, silicon nitride, hafnium oxide, or aluminum oxide. When the second gate insulating film 232 has a thickness of 10 nm or less, there is a risk of electrical connection between the first graphene channel layer 241 and the second graphene channel layer 242, and also, carrier mobility between the first graphene channel layer 241 and the second graphene channel layer 242 may be reduced due to carrier movement therebetween. When the second gate insulating film 232 has a thickness of 200 nm or above, a higher voltage may be required for a gate electrode 220 to control the graphene channel layers 241 and 242.

A first gate insulating film 231 may be formed on the first graphene channel layer 241. The first gate insulating film 231 may be formed to a thickness in a range from about 10 nm to about 200 nm by using silicon oxide, silicon nitride, hafnium oxide, or aluminum oxide.

The gate electrode 220 may be formed on the first gate insulating film 231. The gate electrode 220 may be formed of a conductive metal. The second graphene channel layer 242 may have a length greater than that of the first graphene channel layer 241.

A source electrode 250 and a drain electrode 260 respectively connected to edges of the first and second graphene channel layers 241 and 242 may be formed on the insulating film 212. Charge movement from the source electrode 250 to the drain electrode 260 may be realized through the first and second graphene channel layers 241 and 242.

The graphene electronic device 200 of FIG. 5 is a top gate transistor. When the first and second graphene channel layers 241 and 242 are formed to have a width in a range from about 1 nm to about 20 nm, the first and second graphene channel layers 241 and 242 may have a semiconductor characteristic having a band gap due to a size effect. Accordingly, the graphene electronic device 200 of FIG. 5 is a field effect transistor. A field effect transistor that uses graphene as a channel may be operated at room temperature.

When the first and second graphene channel layers 241 and 242 are formed to have a width of about 100 nm or above, the graphene channel layer, as an electric conductor, may have a carrier mobility of 100,000 $cm^2V^{-1}s^{-1}$, which is about 100 times greater than that of silicon. The graphene electronic device having the graphene channel layer may be used as an RF transistor.

A graphene electronic device according to example embodiments may include double graphene channel layers, and thus, current mobility between a source electrode and a drain electrode may be increased. Therefore, a driving voltage may be lower and a driving speed may be increased.

While the inventive concepts have been particularly shown and described with reference to example embodiments thereof, it will be understood by those of ordinary skill in the art that various changes in form and details may be made therein without departing from the spirit and scope of the following claims.

What is claimed is:

1. A graphene electronic device comprising:
a gate electrode on a substrate;
a first gate insulating film on the substrate to cover the gate electrode;
a plurality of graphene channel layers on the first gate insulating film;
a second gate insulating film between the plurality of the graphene channel layers;
a source electrode directly connected to one edge of each of the plurality of the graphene channel layers; and
a drain electrode directly connected to another edge of each of the plurality of the graphene channel layers,
wherein the plurality of the graphene channel layers includes a first graphene channel layer on the first gate insulating film and a second graphene channel layer on the second gate insulating film, the second gate insulating film is on the first graphene channel, and each of the first graphene channel layer and the second graphene channel layer has a width in a range of 1 nm to 20 nm, and
wherein the first graphene channel layer has a length greater than that of the second graphene channel layer.

2. The graphene electronic device of claim 1, wherein the gate electrode is embedded in the substrate and an upper surface of the gate electrode contacts the first gate insulating film.

3. The graphene electronic device of claim 1, wherein the substrate is a conductive substrate.

4. The graphene electronic device of claim 1, wherein the second gate insulating film has a thickness in a range from about 10 nm to about 200 nm.

5. The graphene electronic device of claim 1, wherein the source electrode is formed on the first and second graphene channel layers to contact the one edge of each of the first and second graphene channel layers, and the drain electrode is formed on the first and second graphene channel layers to contact the other edge of each of the first and second graphene channel layers.

6. The graphene electronic device of claim 1, wherein the second gate insulating film is formed of a material selected from the group consisting of silicon oxide, silicon nitride, hafnium oxide, and aluminum oxide.

7. The graphene electronic device of claim 1, wherein the first graphene channel layer and the second graphene channel layer are separated from each other in a direction vertical to the substrate and parallel to each other in a length direction of the substrate.

8. A graphene electronic device comprising:
an insulating layer covering a substrate;
a plurality of graphene channel layers on the substrate;
a source electrode connected to one edge of each of the plurality of the graphene channel layers;
a drain electrode connected to another edge of each of the plurality of the graphene channel layers;
a first gate insulating film covering the plurality of the graphene channel layers between the source electrode and the drain electrode;
a second gate insulating film between the plurality of the graphene channel layers; and
a gate electrode on the first gate insulating film,
wherein the plurality of graphene channel layers includes a first graphene channel layer on the second gate insulating film and a second graphene channel layer on the insulating layer, the second gate insulating film is on the second graphene channel layer, and each of the first graphene channel layer and the second graphene channel layer has a width in a range of 1 nm to 20 nm, and
wherein the second graphene channel layer has a length greater than that of the first graphene channel layer.

9. The graphene electronic device of claim 8, wherein the second gate insulating film has a thickness in a range from about 10 nm to about 200 nm.

10. The graphene electronic device of claim 8, wherein the source electrode is formed on the first and second graphene channel layers to contact the one edge of each of the first and second graphene channel layers, and the drain electrode is formed on the first and second graphene channel layers to contact the other edge of each of the first and second graphene channel layers.

11. The graphene electronic device of claim 8, wherein the second gate insulating film is formed of a material selected from the group consisting of silicon oxide, silicon nitride, hafnium oxide, and aluminum oxide.

12. The graphene electronic device of claim 8, wherein the first graphene channel layer and the second graphene channel layer are separated from each other in a direction vertical to the substrate and parallel to each other in a length direction of the substrate.

\* \* \* \* \*